(12) United States Patent
Lee et al.

(10) Patent No.: US 7,098,533 B2
(45) Date of Patent: Aug. 29, 2006

(54) PRINTED CIRCUIT BOARD WITH A HEAT DISSIPATION ELEMENT AND PACKAGE COMPRISING THE PRINTED CIRCUIT BOARD

(75) Inventors: Sung Gue Lee, Gyunggi-do (KR); Yong Il Kim, Incheon-si (KR)

(73) Assignee: LG Electronics Inc., Seoul (KR)

( * ) Notice: Subject to any disclaimer, the term of this patent is extended or adjusted under 35 U.S.C. 154(b) by 164 days.

(21) Appl. No.: 10/934,556

(22) Filed: Sep. 7, 2004

(65) Prior Publication Data

US 2005/0023030 A1    Feb. 3, 2005

Related U.S. Application Data

(62) Division of application No. 10/175,912, filed on Jun. 21, 2002, now Pat. No. 6,803,257.

(30) Foreign Application Priority Data

Jul. 18, 2001    (KR) ................................ 2001-43220

(51) Int. Cl.
  H01L 23/10    (2006.01)
  H01L 23/34    (2006.01)
  H01L 23/043   (2006.01)
  H01L 23/495   (2006.01)
  H01L 31/024   (2006.01)

(52) U.S. Cl. ...................... 257/706; 257/707; 257/708; 257/E31.131; 257/E23.051; 257/691

(58) Field of Classification Search ............... None
See application file for complete search history.

(56) References Cited

U.S. PATENT DOCUMENTS

| | | | | |
|---|---|---|---|---|
| 5,158,912 | A | * 10/1992 | Kellerman et al. | 438/126 |
| 5,633,533 | A | 5/1997 | Andros et al. | 257/707 |
| 5,831,825 | A | * 11/1998 | Fromont | 361/719 |
| 5,844,168 | A | 12/1998 | Schueller et al. | 174/52.4 |
| 5,858,816 | A | 1/1999 | Sato et al. | 438/125 |
| 6,020,637 | A | 2/2000 | Karnezos | 257/738 |
| 6,097,089 | A | 8/2000 | Gaku et al. | 257/712 |
| 6,184,580 | B1 | * 2/2001 | Lin | 257/712 |
| 6,395,582 | B1 | 5/2002 | Sohn et al. | 438/111 |
| 6,856,011 | B1 | * 2/2005 | Choi | 257/687 |

* cited by examiner

Primary Examiner—Luan Thai
(74) Attorney, Agent, or Firm—Fleshner & Kim, LLP

(57) ABSTRACT

A printed circuit board (PCB) with a heat dissipation element, a method for manufacturing the PCB, and a semiconductor package using the PCB dissipates heat generated from the semiconductor chip and reduces a printed circuit board height. The PCB includes a heat sink panel, an alloy panel attached to one surface of the heat sink panel serving to ground and to dissipate heat, a circuit pattern layer having via holes formed on one surface of the alloy panel and electrically coupled to the alloy panel, and a cavity formed by perforating the circuit pattern layer and the alloy panel. A semiconductor chip is on the heat sink panel in the cavity and electrically coupled to the circuit pattern layer. The alloy panels with the circuit patterns can be manufactured in pairs with an insulation carrier therebetween. A plurality of dissipation protrusions can be formed on the surface of the alloy panel or the surface of the heat sink panel to couple the same.

13 Claims, 7 Drawing Sheets

PRINTED CIRCUIT BOARD WITH A HEAT DISSIPATION ELEMENT AND PACKAGE COMPRISING THE PRINTED CIRCUIT BOARD

This application is a Divisional of U.S. patent application Ser. No. 10/175,912, filed Jun. 21, 2002, now U.S. Pat. No. 6,803,257, which claims priority to Korean Patent Application No. 43220/2001, filed Jul. 18, 2001. The entire disclosure of the prior applications are considered as being part of the disclosure of the accompanying application and are hereby incorporated by reference therein.

BACKGROUND OF THE INVENTION

1. Field of the Invention

The present invention relates to a printed circuit board (PCB), and more particularly to a printed circuit board, in which a semiconductor chip is directly mounted on a heat sink panel including an integrally formed ground plane, a method for manufacturing the printed circuit board, and a semiconductor package including the printed circuit board.

2. Background of the Related Art

Many semiconductor chips generate heat during operation. Semiconductor chips, which are used in high frequency and have large scale integrated circuits, generate a larger amount of heat during operation. The heat generated must be dissipated outside the semiconductor chip. Therefore, a heat sink is attached to an electronic package in order to dissipate the heat generated to the outside.

FIG. 1 is a schematic diagram that shows a package 1 using a related art printed circuit board 2. The package 1 is generally referred to as a Ball Grid Array (BGA) package. As shown in FIG. 1, the package 1 includes a semiconductor chip 3 is mounted on the printed circuit board 2. The semiconductor chip 3 is molded with a sealant 4 for protection from the surrounding environment. Solder balls 5 are attached to the lower surface of the printed circuit board 2. The solder balls 5 serve to transmit signals and power from an external device. The semiconductor chip 3 is electrically coupleed to the printed circuit board 2 by gold wires 6 to transmit electrical signals between the semiconductor chip 3 and the printed circuit board 2.

A heat sink 7 is mounted on the upper surface of the semiconductor chip 3. The heat sink 7 serves to dissipate heat generated from the semiconductor chip 3 into the outside. The heat sink 7 is made of thermally conductive metal such as aluminum or the like. A lower surface of the heat sink 7 is attached to the upper surface of the semiconductor chip 3. An upper surface of the heat sink 7 is exposed to the outside. To more effectively dissipate the heat generated into the outside, a plurality of dissipation protrusions 8 may be formed on the upper surface of the heat sink 7, which have a large surface area, to dissipate the heat into the outside.

A large number of functional devices are integrated on the small-sized semiconductor chip 3. Therefore, much heat is generated from the semiconductor chip 3 during operation. The heat sink 7 is used to dissipate the generated heat.

If the heat is not properly dissipated, electrons are excited by this heat. Then, the semiconductor chip 3 cannot exhibit its specific performance. Therefore, the heat sink 7 must be used to dissipate the heat generated from the chip 3 into the outside.

However, as described above, the related art package provided with the heat sink has various problems. Since the heat sink 7 is formed separately from the printed circuit board 2, the heat sink 7 is attached to the printed circuit board 2 to form the package 1. Therefore, the height of the package 1 is increased. Further, it is difficult to miniaturize the package 1. In manufacturing the printed circuit board 2, a ground plane for grounding circuits formed on the printed circuit board 2 must be additionally formed. The additional ground plane increases the number of layers of the printed circuit board 2 and the height of the package 1 using the printed circuit board 2.

When the printed circuit board 2 having the semiconductor chip 3 becomes multi-layered, the height of the printed circuit board 2 is increased, which increases the height of the package 1 using the printed circuit board 2. In addition, when using the multi-layered printed circuit board, through holes for coupling the solder balls to the ground plane are required. The through holes are formed by perforating the printed circuit board. The through holes are coupled to the ground plane. Therefore, the printed circuit board requires increased or large areas for forming the through holes, which also limits variety in designing the printed circuit board.

In cases where a heat dissipation layer of the multi-layered printed circuit board is not directly connected to the semiconductor chip, through holes for transmitting the heat generated from the chip to the heat dissipation layer are also required. Of course, the related art printed circuit board requires additional areas for forming the through holes for transmitting the heat, which also limits the variety in designing the printed circuit board.

The above references are incorporated by reference herein where appropriate for appropriate teachings of additional or alternative details, features and/or technical background.

SUMMARY OF THE INVENTION

An object of the invention is to solve at least the above problems and/or disadvantages and to provide at least the advantages described hereinafter.

Another object of the present invention to provide a printed circuit board, a method for manufacturing a printed circuit board, and a semiconductor package including a printed circuit board that substantially obviates one or more of the disadvantages of the related art.

Another object of the present invention is to provide a printed circuit board, a method for manufacturing a printed circuit board, and a semiconductor package including a printed circuit board that includes a heat dissipation element.

Another object of the present invention is to provide a printed circuit board, a method for manufacturing a printed circuit board, and a semiconductor package including a printed circuit board that includes an alloy panel electrically and thermally coupled to a signal layer formed on the alloy panel that serves as a grounding and for heat dissipation.

Another object of the present invention is to provide a printed circuit board, a method for manufacturing a printed circuit board, and a semiconductor package including a printed circuit board that is capable of unrestrictedly designing the printed circuit board and miniaturizing a package using the printed circuit board.

To achieve at least the above objects in a whole or in part and in accordance with the present invention, there is provided a printed circuit board that includes a heat dissipation element, the printed circuit board (PCB) having a heat sink panel, an alloy panel attached to one surface of the heat sink panel, the alloy panel having a designated hardness, a circuit pattern layer formed on one surface of the alloy panel, the circuit pattern layer having circuit patterns and via holes electrically coupled to the alloy panel, and a cavity in the circuit pattern layer and the alloy panel to expose a portion of the heat sink panel.

To further achieve the above objects in a whole or in part and in accordance with the present invention, there is provided a method for manufacturing a printed circuit board with a heat dissipation element that includes attaching two alloy panels to each other using an insulation carrier layer interposed therebetween, each of the alloy panels serving to dissipate heat, attaching an insulation layer and a conductive layer on one surface of the each alloy panel, forming via holes by perforating the insulation layers and the conductive layers, forming a plating layer for coupling each conductive layer to the alloy panel through the via holes, forming a circuit pattern layer on the each conductive layer, separating the two alloy panels with the circuit pattern layer from each other by dividing the insulation carrier layer, and attaching a heat sink panel to the other surface of at least one alloy panel.

To further achieve the above objects in a whole or in part and in accordance with the present invention, there is provided a semiconductor package that includes a heat sink panel made of metal, an alloy panel attached to one surface of the heat sink panel, the alloy panel operating as a reference voltage level and to dissipate heat, a circuit pattern layer formed on one surface of the alloy panel, the circuit pattern layer having circuit patterns, a plurality of connection pads, and via holes electrically coupled to the alloy panel, a cavity in the circuit pattern layer and the alloy panel to expose the one surface of the heat sink panel, a semiconductor element mounted on the exposed surface of the heat sink panel within the cavity and a conductive element for electrically coupling the semiconductor element to the connection pads of the circuit pattern layer.

To further achieve the above objects in a whole or in part and in accordance with the present invention, there is provided a method for manufacturing a printed circuit board that includes forming an alloy panel, forming a circuit pattern on a first surface of the alloy panel, attaching a first surface of a heat sink panel to a second surface of the alloy panel that is opposite the first surface of the alloy panel, forming a cavity in the printed circuit board and the alloy panel to expose the first surface of the heat sink panel.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein.

DETAILED DESCRIPTION OF PREFERRED EMBODIMENTS

FIGS. 2a to 2i are diagrams that illustrate a first preferred embodiment of a manufacturing process for a printed circuit board in accordance with the present invention.

Figure 1:
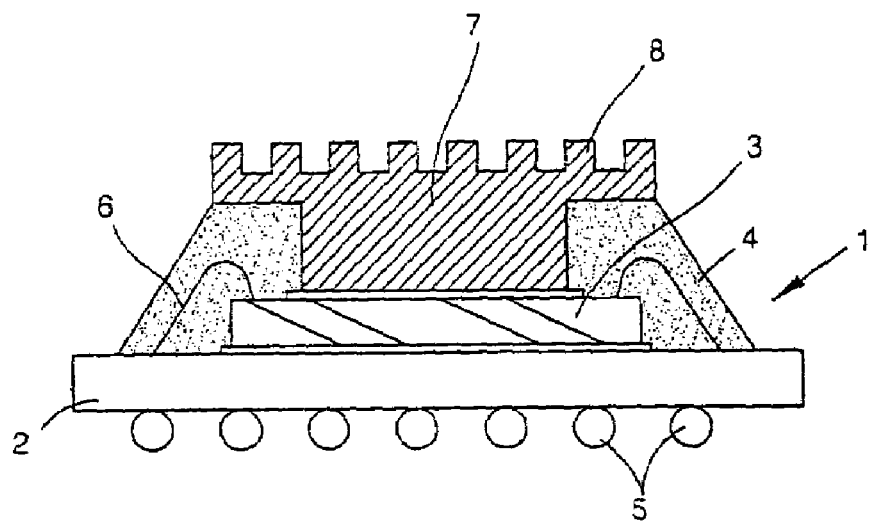
FIG. 1 is a diagram that shows schematic view of a package using a related art printed circuit board.
Figure 2A:
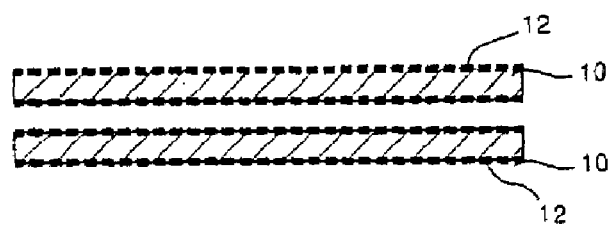
FIGS. 2a to 2i are diagrams that illustrate a manufacturing process of a printed circuit board in accordance with a preferred embodiment of the present invention.

FIGS. 2a–2h show two alloy panels 10, each preferably has an oxide layer 12 formed on its surface. As shown in FIG. 2a, each alloy panel 10, which is made of copper alloy and aluminum alloy or the like, is prepared. The alloy panel 10 preferably serves as the grounding as well as the heat dissipation. As shown in FIG. 2a, one reason the oxide layer 12 is formed on the alloy panel 10 is that the formation of the oxide layer 12 makes the surface of the alloy panel 10 rough for easy and secure attachment to an insulation layer 30 (see FIG. 2b) or an insulation carrier 20 (see FIG. 2b).

Figure 2B:
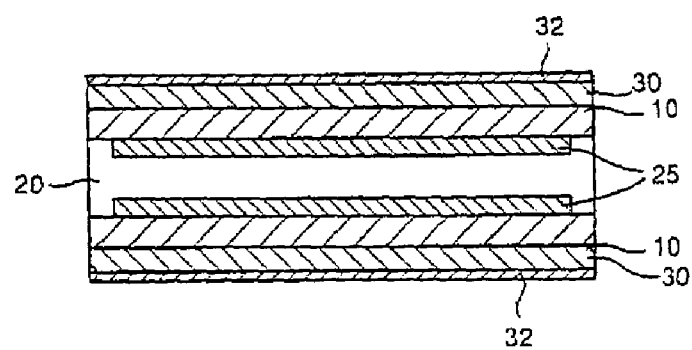

As shown in FIG. 2b, two alloy panels 10 are preferably bonded to each other. That is, one alloy panel 10 is attached to the upper surface and the lower surface of the insulation carrier 20 by interposing a release film 25 between the alloy panel 10 and the insulation carrier 20. In this manner, two printed circuit boards can be simultaneously manufactured. Further, two printed circuit boards are easily separated from each other using the release film 25.

The release film 25 preferably has a little smaller size than that of the alloy panel 10. That is, the release film 25 is not attached to the edge of the alloy panel 10. Therefore, the edges of two alloy panels 10 are directly attached to a portion of the insulation carrier 20, and other areas of two alloy panels 10, e.g., the centers of two alloy panels 10, are attached to the insulation carrier 20 by the release film 25 interposed therebetween. Thus, the center of the alloy panel 10 is not in contact with the insulation carrier 20.

An insulation layer 30 is formed on the exposed oxide layer 12 of the alloy panel 10. A thin copper layer 32 is preferably attached to the insulation layer 30. Alternatively, a copper laminated plate with a copper layer 32 formed on its one surface may be attached to the alloy panel 10.

An etching resist 40 or the like is coated on the copper layer 32. The etching resist 40 includes etching windows 34 for exposing the copper layer 32. Later on, the copper layer 32 exposed by the etching windows 34 is removed by etching. The copper layer 32 coated by the etching resist 40 is not removed and still left.

Figure 2C:
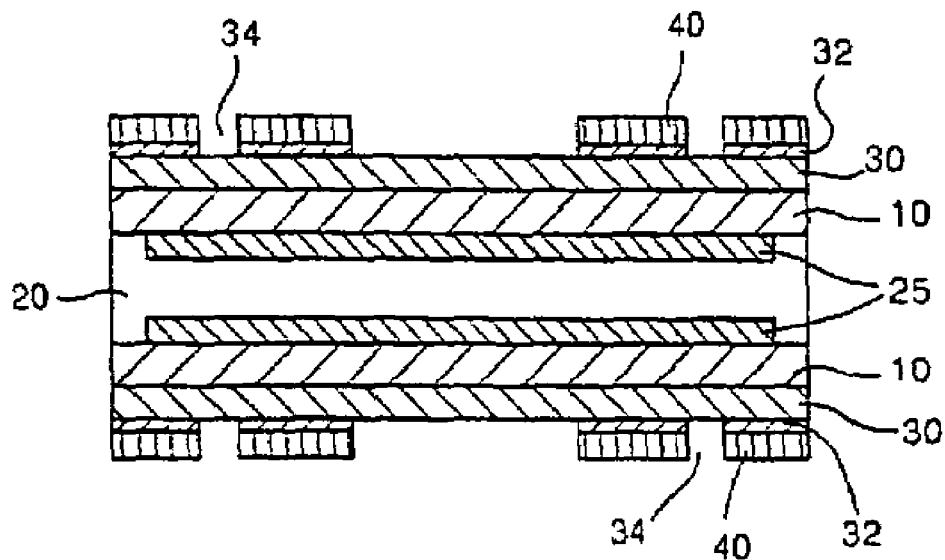

FIG. 2c shows the alloy panels 10 with the copper layer 32 exposed by the etching windows 34 of the etching resist 40 removed to expose the insulation layer 30. The copper layer 32 coated by the etching resist 40 is not removed.

The remaining etching resist 40 is removed preferably by peeling. Then, the insulation layer 30 exposed by the etching windows 34 is removed, thereby forming via holes 36. Thus, the alloy panel 10 is preferably exposed by removing the exposed insulation layer 30.

Figure 2D:
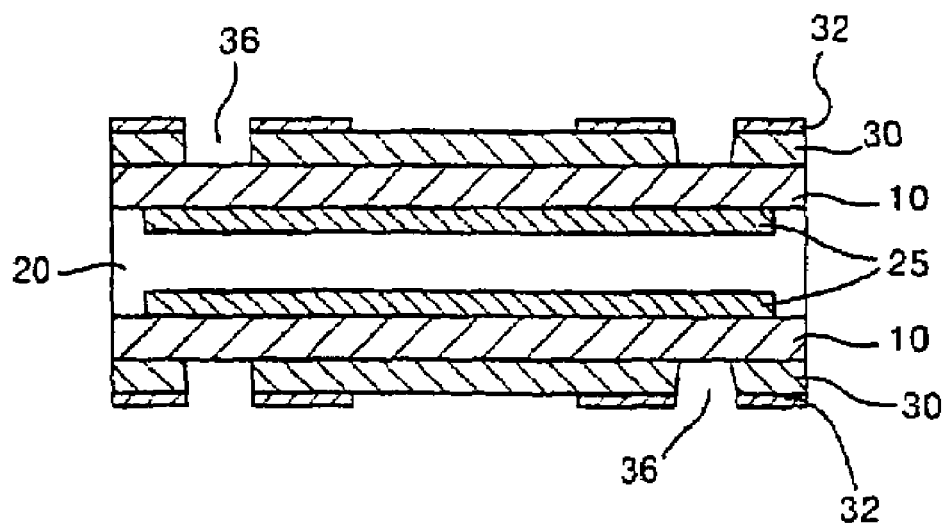

FIG. 2d shows the alloy panels 10, in which the via holes 36 are formed. These via holes 36, for example, may be formed by a photolithography process including an exposing step, a developing step, and an etching step, or may be formed using a laser. Alternatively, the via holes 36 may be mechanically formed using a drill or the like.

A plating layer 50 is formed on the insulation layer 30 including the via holes 36. Later, the plating layer 50 preferably serves as circuit patterns together with the copper layer 32. Therefore, preferably, the plating layer 50 may be made of copper.

Figure 2E:
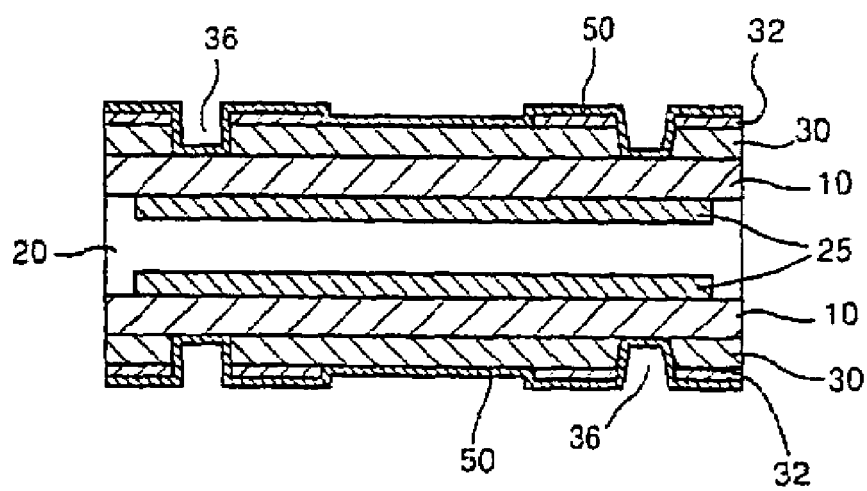

FIG. 2e shows the alloy panels 10, in which the plating layer 50 is formed on the insulation layer 30 and the via holes 36. Alternatively, instead of the plating layer 50, the via holes 36 may be filled with a conductive paste, thereby electrically coupling the via holes 36 to the alloy panel 10.

Next, circuit patterns 52 are formed. Preferably, an etching resist 60 is coated on the plating layer 50. The coated etching resist 60 is selectively patterned and the plating layer 50 and the copper layer 32 of areas other than the circuit patterns 52 are removed.

That is, the etching resist 60 is selectively exposed to light using an exposure film and is then developed to remove other areas of the etching resist 60 except for the circuit patterns 52. The plating layer 50 and the copper layer 32, which are exposed by selectively removing the etching resist 60, are removed. Thereby, a window 57 for a cavity 82 (see FIG. 2h) for mounting a semiconductor chip is preferably formed on the center of the alloy panel 10.

Figure 2F:
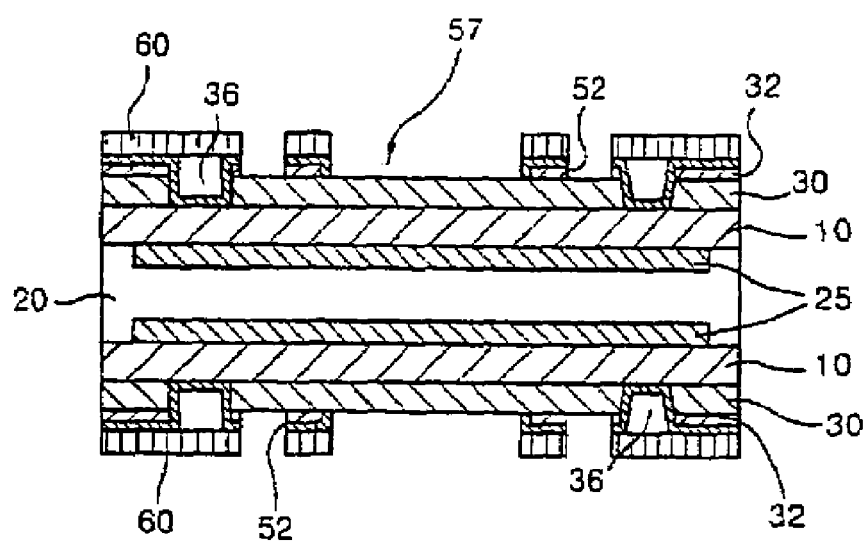

FIG. 2f shows the alloy panels 10, in which the plating layer 50 and the copper layer 32 are selectively removed, and the window 57 for the cavity for mounting the semiconductor chip is formed. The etching resist 60 that coats the circuit patterns 52 of the plating layer 50 is removed preferably by peeling. Then, the circuit patterns 52 are left on the insulation layer 30.

In order to form a multi-layered printed circuit board, a second insulation layer 30' is formed on the insulation layer 30 with the circuit patterns 52. Then, a plating layer is formed on the second insulation layer 30'. Thus, each additional layer (e.g., 52') of the printed circuit board is preferably formed by repeating processes described above and shown in FIGS. 2b to 2f Thereby, the multiple layers can be formed on the printed circuit board.

A photo solder resist 70 is preferably coated on the alloy panel 10. The photo solder resist 70 serves to insulate and protect the uppermost circuit patterns (e.g., 52 or 52'). Bonding pads 54 for wire bonding and ball pads 56 for solder ball bonding are formed on the alloy panel 10. The surfaces of the bonding pads 54 and the surfaces of the ball pads 56 are preferably plated with gold (Au).

Figure 2G:
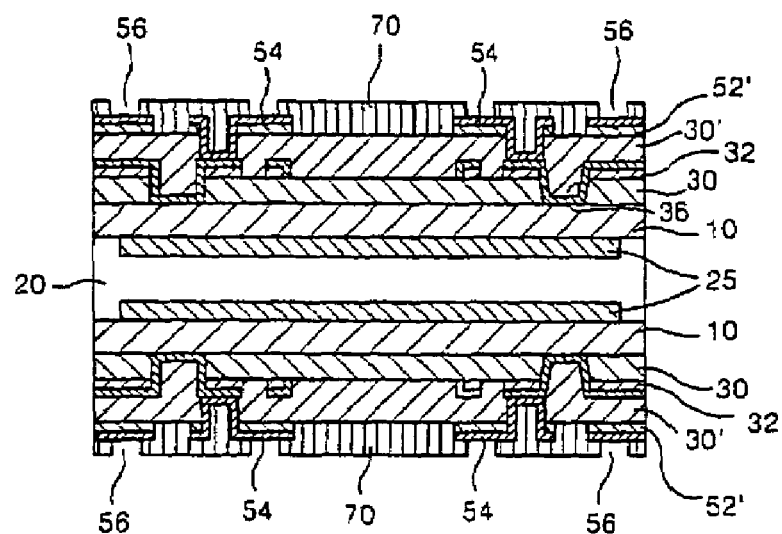

As shown in FIG. 2g, the photo solder resist 70 is not coated on the bonding pads 54 and the ball pads 56. Initially, the photo solder resist is coated on the whole surface of the alloy panel including the circuit patterns 52, the bonding pads 54, and the ball pads 56. Then, the photo resist is removed from the bonding pads 54 and the ball pads 56. FIG. 2g shows the alloy panels 10, in which the bonding pads 54 and the ball pads 56 are formed, and the circuit patterns 52' are insulated by the photo solder resist 70.

Two printed circuit boards 80, which are formed on the upper and the lower surfaces of the insulation carrier 20, are separated from each other by dividing the insulation carrier 20. Since the center of the alloy panel 10 is attached to the insulation carrier 20 by the peelable film 25 interposed therebetween, the alloy panels 10 are easily separated from each other by dividing the insulation carrier 20, such as along a dotted line shown in FIG. 2h. This method is disclosed by U.S. Pat. No. 6,210,518, which is assigned to the same assignee as the present invention, and the entire disclosure is hereby incorporated by reference.

Figure 2H:
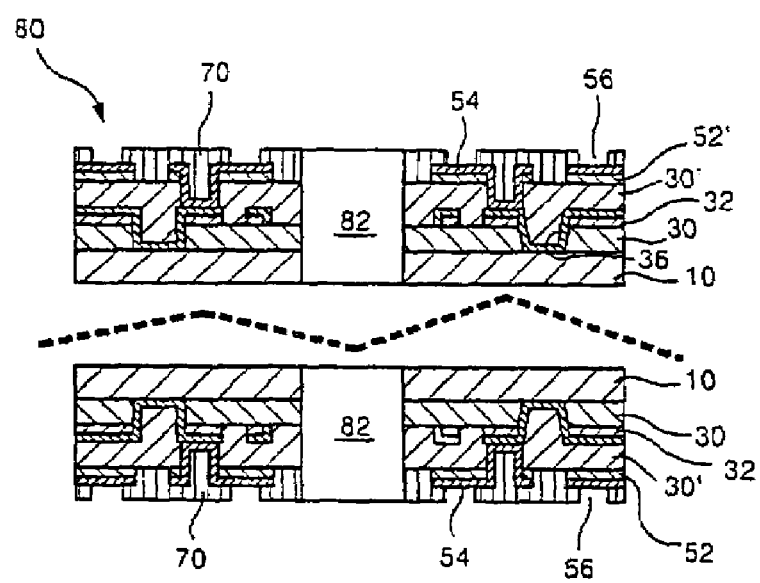

The cavity 82 for mounting the semiconductor chip is preferably formed on the center of each printed circuit board 80 using a router drill, however other methods can be used. Herein, the cavity 82 is formed by perforating the center of the printed circuit board 80. FIG. 2h shows the printed circuit boards 80, in which the cavity 82 is formed.

Figure 2I:
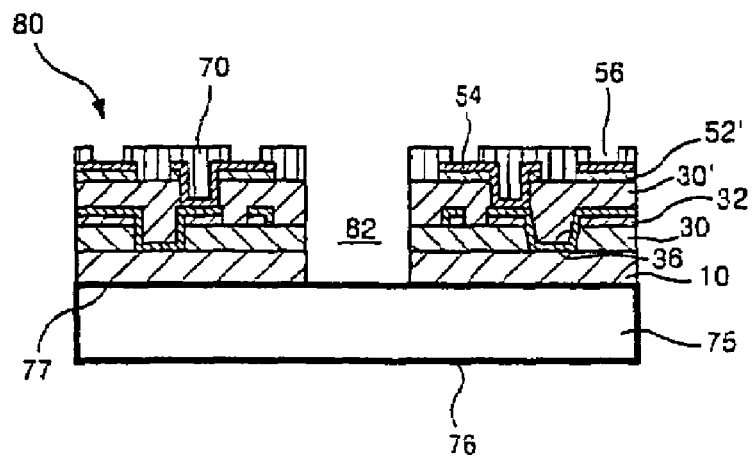
Figure 3:
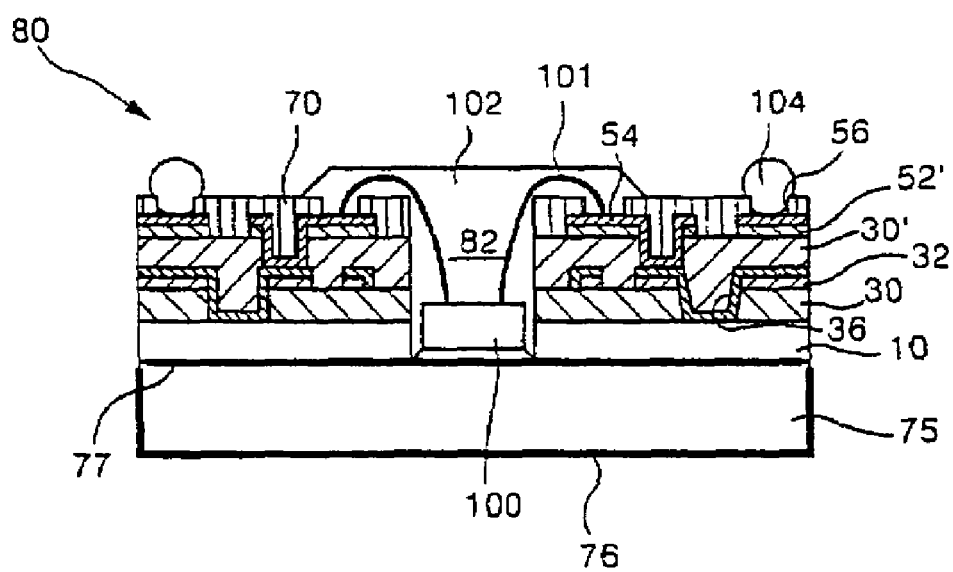
FIG. 3 is a diagram that shows cross-sectional view of a package using the printed circuit board in accordance with a preferred embodiment of the present invention.

After forming the cavity 82, a heat sink panel 75 is attached to the lower surface of the alloy panel 10, thereby completing the manufacturing process of the printed circuit board 80 in accordance with the first preferred embodiment according to the present invention. Herein, the heat sink panel 75 is attached to the lower surface of the alloy panel 10 by a Prepreg 77 or a conductive adhesive. The heat sink panel 75 serves to dissipate heat generated from the printed circuit board 80 and the semiconductor chip 100 as shown in FIG. 3 into the outside. A coating layer 76 is formed on the exposed surface of the heat sink panel 75. FIG. 2i shows the printed circuit board 80, in which the heat sink panel 75 is attached to the lower surface of the alloy panel 10.

FIG. 3 is a diagram that shows cross-sectional view showing a preferred embodiment of a package according to the present invention. As shown in FIG. 3, the package can use the printed circuit board of FIG. 2i. As shown in FIG. 3, the semiconductor chip 100 is mounted on the upper surface of the heat sink panel 75 through the cavity 82 of the printed circuit board 80.

The semiconductor chip 100 is preferably electrically coupled to the printed circuit board 80 by coupling chip pads (not shown) of the semiconductor chip 100 to the bonding pads 54 of the printed circuit board 80 by wires 101. The semiconductor chip 100, the wires 101, and the bonding pads 54 coupled to the wires 101 are preferably molded with a sealant 102 for protection from the surrounding environment. Then, solder balls 104 are attached to the corresponding ball pads 56. The solder balls 104 serve to electrically couple the preferred embodiment of the package of FIG. 3 to an external device. Beneficially, in this preferred embodiment according to the present invention, the heat sink panel 75 of the printed circuit board 80 serves to ground the package as well as to dissipate the heat generated from the semiconductor chip 100.

FIGS. 4a to 4d are diagrams that illustrate a preferred embodiment of a manufacturing process of a heat sink panel employed in a printed circuit board in accordance with the present invention. The preferred embodiment of the manufacturing process of the heat sink panel for the printed circuit board will now be described with reference to FIGS. 4a to 4d.

Figure 4A:
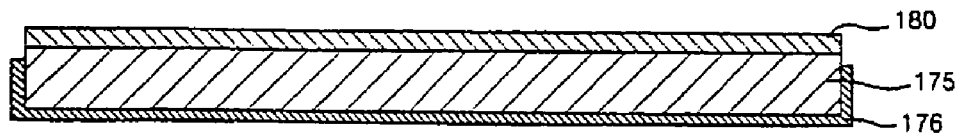
FIGS. 4a to 4d are diagrams that illustrate a manufacturing process of a heat sink panel employed in a printed circuit board in accordance with another preferred embodiment of the present invention.

As shown in FIG. 4a, a heat sink panel 175 is prepared. A coating layer 176 is formed on the lower surface and the side surfaces of the heat sink panel 175. Then, a dry film 180 is formed on the upper surface of the heat sink panel 175.

Figure 4B:
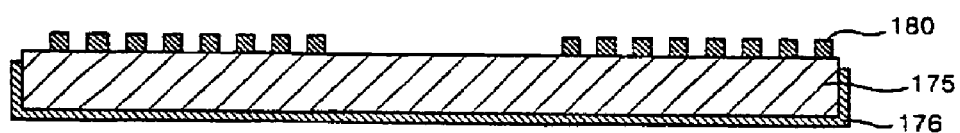

As shown in FIG. 4b, portions of the dry film 180 are selectively removed. The dry film 180 is preferably selectively exposed to light and developed, thereby selectively removing the dry film 180 and exposing the surface the heat sink panel 175. The dry film 180 is preferably left on portions of the heat sink panel on which dissipation protrusions 178 will be formed.

Figure 4C:
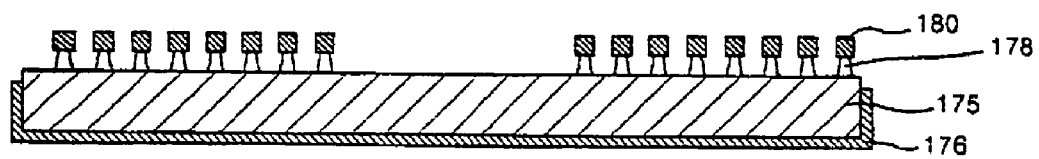
Figure 4D:
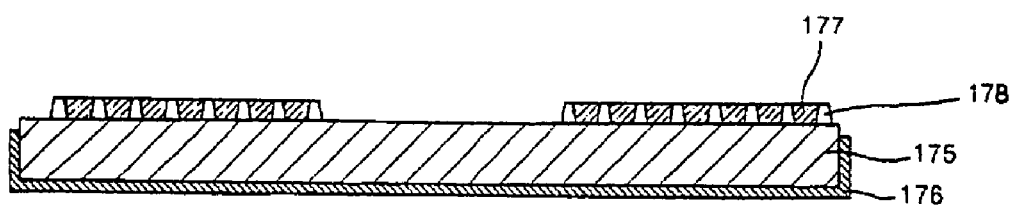

The surface of the heat sink panel 175 exposed by the selectively removed dry film 180 is etched to a designated depth to form the dissipation protrusions 178. FIG. 4c shows the heat sink panel 175 in which plurality of the dissipation protrusions 178 are formed.

The dry film 180 is removed. The spaces between the dissipation protrusions 178 on the upper surface of the heat sink panel 175 are filled with an insulating material 177.

Filling the spaces with the insulating material 177 can be done using various different methods. For example, the insulating material 177 is coated on the upper surface of the heat sink panel 175 and rendered molten at a high temperature to fill the spaces between the dissipation protrusions 178. Alternatively, an insulating film mounted on the upper surface of the heat sink panel 175 can be pressed by a roller or the like to fill the spaces between the dissipation protrusions 178.

Figure 5:
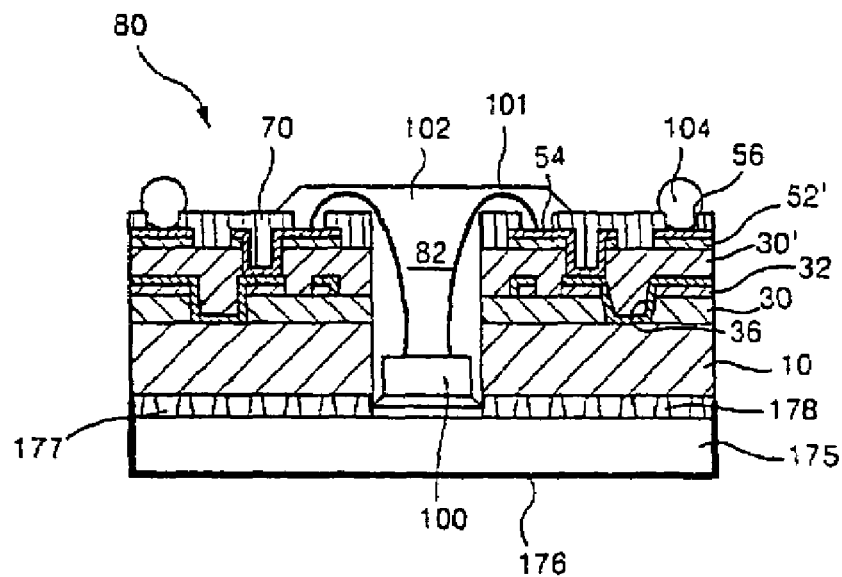
FIG. 5 is a diagram that shows a cross-sectional view of a package using the printed circuit board including a heat sink panel in accordance with another preferred embodiment of the present invention.
Figure 6:
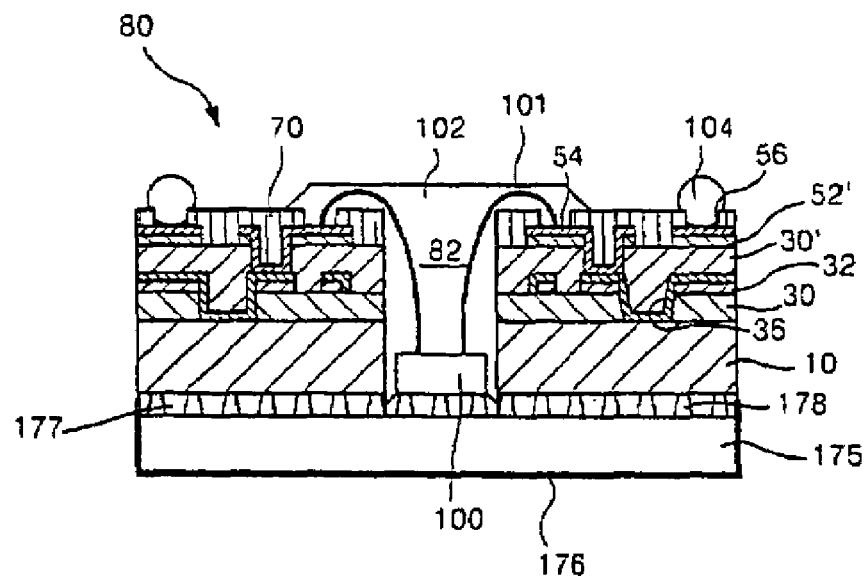
FIG. 6 is a diagram that shows a cross-sectional view of a package using a printed circuit board including a heat sink panel in accordance with yet another preferred embodiment of the present invention.

The heat sink panel 175 filled with the insulating material 177 is attached to the lower surface of a PCB, such as the printed circuit board 80 manufactured by the process of FIGS. 2a–2i. FIGS. 5 and 6 show preferred embodiments of packages using the printed circuit board 80 employing the heat sink panel 175 with the dissipation protrusions 178, respectively.

As shown in FIG. 5, the heat sink panel 175 does not form the dissipation protrusions 178 on a chip mounting area of the upper surface. FIG. 6 shows the heat sink panel 175 in which the dissipation protrusions 178 are formed on the whole of the upper surface of the heat sink panel 177 including the chip mounting area.

Although the dissipation protrusions 178 are formed on the surface of the heat sink panel 175 in preferred embodiments, the present invention is not intended to be so limited. For example, dissipation protrusions may be formed on the surface of the alloy panel 10.

As described above, the dissipation protrusions 178 formed on the heat sink panel 175 or the dissipation protrusions formed on the alloy panel 10 serve to improve the heat conductivity. If a dissipation protrusion is not formed on the heat sink panel 175 or the alloy panel 10, an adhesive is interposed between the heat sink panel 175 and the alloy panel 10, which can lower the heat conductivity. That is, the dissipation protrusions 178 of the heat sink panel 175 are preferably directly attached to the chip 100 or the alloy panel 10 to increase the heat conductivity and effectively ground the same.

In accordance with the preferred embodiments of the present invention, the spaces between the dissipation protrusions 178 of the heat sink panel 175 are preferably filled with the Prepreg 177 or the conductive adhesive. The heat sink panel 175 is attached to the lower surface of the alloy panel 10 by the Prepreg 177 or the conductive adhesive.

Operations of the preferred embodiment of printed circuit board 80 according to the present invention will now be described. The cavity 82 for mounting the semiconductor chip 100 is preferably formed on the center of the printed circuit board 80. However, the present invention is not intended to be so limited. The semiconductor chip 100 is mounted on the heat sink panel 75 through the cavity 82. Preferably, after the cavity 82 is formed on the printed circuit board 80, the heat sink panel 75 is attached to the lower surface of the printed circuit board 80. Forming the cavity 82 on the printed circuit board 80 can be simple since the cavity 82 can be formed, for example, only by perforating the printed circuit board 80.

According to preferred embodiments of the present invention, the heat sink panel 75 is attached to the lower surface of the printed circuit board 80 by interposing the Prepreg 77 therebetween. Therefore, compared with the related art using an adhesive, the adhesive strength between the heat sink panel 75 and the printed circuit board 80 is increased. Further, voids are not generated between the heat sink panel 75 and the printed circuit board 80, thereby improving the reliability of the package. Further, in preferred embodiments of the present invention, the semiconductor chip 100 is mounted within the cavity 82, thereby reducing or minimizing a height of the package.

During the manufacturing process of the printed circuit board 80, the alloy panel 10 and the layers formed on the upper surface of the alloy panel 10 are electrically and thermally interconnected by the via holes 36. Thereby, the alloy panel 10 serves as the ground as well as the heat sink. The ground capacity is increased by utilizing the alloy panel 10 of the preferred embodiments, which reduces the number of the ground layers to be formed on the alloy panel 10 and decreases an overall height of the printed circuit board 80.

According to preferred embodiments of the present invention, the heat generated from the semiconductor chip 100 as well as the heat transmitted via the alloy panel 10 is more effectively dissipated to the outside via the heat sink panel 75. Preferably, a heat sink panel is used as one layer of the printed circuit board.

In accordance with preferred embodiments of the present invention shown in FIGS. 4 to 6, the dissipation protrusions 178 are formed on the surface of the heat sink panel 175. The dissipation protrusions 178 of the heat sink panel 175 directly contact the lower surface of the alloy panel 10. Therefore, the heat sink panel 175 with the dissipation protrusions 178 serves as the ground and the heat sink for dissipating the heat transmitted via the alloy panel 10 into the outside, which also reduces or minimizes the whole height of the printed circuit board 80.

In accordance with preferred embodiments of the present invention, the alloy panel 10 serving as the ground is electrically and thermally coupled to the circuit patterns 52 formed on the alloy panel 10 by the via holes 36. Therefore, the related through holes for coupling the solder balls to the ground plane are not required, thereby more effectively using the space of the printed circuit board 80.

According to preferred embodiments of the present invention, the number of the layers of the printed circuit board is reduced or minimized, thereby simplifying the manufacturing process and reducing the production cost.

According to preferred embodiments of the present invention, the spaces of the layers of the printed circuit board are more effectively utilized, and the number of the layers of the printed circuit board is minimized, thereby simplifying the manufacturing process and reducing the production cost.

Further, the alloy panel can be produced by methods forming two alloy panels with one adhesive therebetween.

The foregoing embodiments and advantages are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art. In the claims, means-plus-function clauses are intended to cover the structures described herein as performing the recited function and not only structural equivalents but also equivalent structures.

What is claimed is:

1. A printed circuit board with a heat dissipation element, said printed circuit board (PCB) comprising:

a heat sink panel;

an alloy panel attached to one surface of the heat sink panel, said alloy panel having a designated hardness;

a circuit pattern layer formed on one surface of the alloy panel, said circuit pattern layer having circuit patterns and via holes electrically coupled to the alloy panel; and a cavity in the circuit pattern layer and the alloy panel to expose a portion of the heat sink panel, wherein a plurality of dissipation protrusions are formed on a lower surface of the alloy panel, wherein the alloy panel is directly attached to the heat sink panel by the dissipation protrusions.

2. The printed circuit board with the heat dissipation element of claim 1, wherein the circuit pattern layer is multi-layered.

3. The printed circuit board with the heat dissipation element of claim 1, wherein the alloy panel is attached to one surface of the heat sink panel by a conductive adhesive, and wherein a semiconductor chip is mounted on the portion of the heat sink panel in said cavity.

4. The printed circuit board with the heat dissipation element of claim 1, wherein the heat sink panel dissipates heat transmitted from the circuit pattern to the alloy panel.

5. The printed circuit board with the heat dissipation element of claim 1, wherein the exposed portion of the heat sink panel is on the one surface of the heat sink panel, and wherein a semiconductor chip is mounted on the portion of the heat sink panel in said cavity.

6. The printed circuit board with the heat dissipation element of claim 1, wherein a height of the alloy panel is at least half a height of the semiconductor element.

7. The printed circuit board with the heat dissipation element of claim 1, wherein the alloy panel serves as an electrical ground to the PCB and dissipates heat.

8. A semiconductor package comprising:
a heat sink panel made of metal;
an alloy panel attached to one surface of the heat sink panel, said alloy panel operating as a reference voltage level and to dissipate heat;
a circuit pattern layer formed on one surface of the alloy panel, said circuit pattern layer having circuit patterns, a plurality of connection pads, and via holes electrically coupled to the alloy panel;
a cavity in the circuit pattern layer and the alloy panel to expose the one surface of the heat sink panel;
a semiconductor element mounted on the exposed surface of the heat sink panel within the cavity; and
a conductive element for electrically coupling the semiconductor element to the connection pads of the circuit pattern layer, wherein a plurality of dissipation protrusions are formed on one of a lower surface of the alloy panel or the one surface of the heat sink panel, and wherein the alloy panel is directly attached to the heat sink panel by the dissipation protrusions.

9. The semiconductor package of claim 8, wherein the semiconductor element is a semiconductor chip, and a sealant that fills the cavity.

10. The semiconductor package of claim 8, wherein the plurality of dissipation protrusions are formed on the lower surface of the alloy panel.

11. The semiconductor package of claim 10, wherein spaces between the dissipation protrusions are filled with insulation material.

12. The semiconductor package of claim 8, wherein the alloy panel is attached to the heat sink panel by a conductive adhesive.

13. The semiconductor package of claim 8, wherein a height of the alloy panel is at least half a height of the semiconductor element.

\* \* \* \* \*